United States Patent [19]

Neu

[11] Patent Number: 5,484,274

[45] Date of Patent: Jan. 16, 1996

[54] ENCAPSULATION MOLDING EQUIPMENT

[75] Inventor: H. Karl Neu, Furlong, Pa.

[73] Assignee: Neu Dynamics Corp., Ivyland, Pa.

[21] Appl. No.: 337,668

[22] Filed: Nov. 10, 1994

Related U.S. Application Data

[63] Continuation of Ser. No. 271,149, Jul. 6, 1994, Pat. No. 5,409,362, which is a continuation-in-part of Ser. No. 108,335, Aug. 18, 1993, abandoned, which is a continuation-in-part of Ser. No. 52,545, Apr. 23, 1993, Pat. No. 5,405,255, which is a continuation-in-part of Ser. No. 981,742, Nov. 24, 1992, Pat. No. 5,316,463.

[51] Int. Cl.$^6$ .................................................. B29C 45/34
[52] U.S. Cl. .......................... 425/116; 425/121; 425/125; 425/183; 425/190; 425/546; 425/588; 425/812
[58] Field of Search ......................... 264/272.17; 249/91, 249/95, 96, 41; 425/116, 121, 812, 544, 546, 588, 192 R, 184, 186, 183, 190, DIG. 228, 125

[56] References Cited

U.S. PATENT DOCUMENTS

| | | | |
|---|---|---|---|
| 3,650,648 | 3/1972 | Lambrecht | 425/129 |
| 3,733,159 | 5/1973 | Coffman | 425/186 |
| 3,799,494 | 3/1974 | McLean, Jr. | 249/119 |
| 3,813,201 | 5/1974 | Frederick et al. | 425/242 |
| 3,859,023 | 1/1975 | Pasch | 425/251 |
| 3,889,919 | 6/1975 | Ladney, Jr. | 249/141 |
| 4,044,984 | 2/1977 | Shimizu et al. | 425/116 |
| 4,126,292 | 11/1978 | Saeki et al. | 249/110 |
| 4,332,537 | 6/1982 | Slepcevic | 425/121 |
| 4,368,168 | 1/1983 | Slepcevic | 264/272.14 |
| 4,374,636 | 2/1983 | Holmes | 425/589 |
| 4,442,056 | 4/1984 | Slepcevic | 264/161 |
| 4,480,975 | 11/1984 | Plummer et al. | 425/116 |
| 4,513,942 | 4/1985 | Creasman | 425/588 |
| 4,599,062 | 7/1986 | Konishi | 264/272 |
| 4,620,958 | 11/1986 | Wiechard | 264/297.2 |
| 4,695,420 | 9/1987 | Grawey et al. | |
| 4,697,704 | 10/1987 | Schmid | 425/588 |
| 4,779,835 | 10/1988 | Fukushima et al. | 249/161 |
| 4,795,331 | 1/1989 | Cain et al. | 425/28.1 |
| 4,812,114 | 3/1989 | Kennon et al. | |
| 4,828,479 | 5/1989 | Pleasant | 425/192 R |
| 4,829,670 | 5/1989 | Hilgers | |
| 4,861,251 | 8/1989 | Moitzger | 425/116 |

(List continued on next page.)

FOREIGN PATENT DOCUMENTS

| | | |
|---|---|---|
| 53-143656 | 12/1978 | Japan . |
| 54-153866 | 12/1979 | Japan . |
| 55-128835 | 10/1980 | Japan . |
| 57-18210 | 1/1982 | Japan . |
| 58-8608 | 1/1983 | Japan . |
| 62-130531 | 6/1987 | Japan . |
| 62-273814 | 11/1987 | Japan . |
| 1-170088 | 7/1989 | Japan . |
| 2-154434 | 6/1990 | Japan . |
| 3-116939 | 5/1991 | Japan . |
| 2104827 | 3/1983 | United Kingdom . |
| 2248580 | 4/1992 | United Kingdom . |

*Primary Examiner*—Khanh P. Nguyen
*Attorney, Agent, or Firm*—Synnestvedt & Lechner

[57] ABSTRACT

Encapsulation molding equipment includes individual loading bars each having an elongated support surface which receives strip-like carriers supporting semi-conductor chips and like objects for encapsulation. Cavity inserts having plural rows of cavities of different size and dimension individual to carriers having like numbers of chips of a range of size and dimension fit over the strips with each cavity on an insert surrounding the chip to be encapsulated. Converging gate passages and vent passages are formed on the surface of the insert spaced away from the mold base member for supply of resin from a central resin receptacle to the cavities. Support of the cavity inserts independent of the loading bars and resilient mounting of the loading bars is disclosed. The mold is completed by an upper mold member which closes the mold and effects a seal between the mold parts and provides for delivery of encapsulating resin to the cavities in the cavity inserts. Each mold base has a plurality of recesses, each of which receives a carrier strip and a cavity insert.

4 Claims, 7 Drawing Sheets

U.S. PATENT DOCUMENTS

| | | | |
|---|---|---|---|
| 4,862,586 | 9/1989 | Osada | 29/827 |
| 4,944,908 | 7/1990 | Leveque et al. | |
| 5,008,062 | 4/1991 | Anderson et al. | |
| 5,049,055 | 9/1991 | Yokoyama | |
| 5,052,907 | 10/1991 | Matumoto et al. | |
| 5,059,373 | 10/1991 | Hirabayashi | |
| 5,077,237 | 12/1991 | Hara | |
| 5,082,615 | 1/1992 | Sakai | |
| 5,108,278 | 4/1992 | Tsutsumi et al. | |
| 5,108,955 | 4/1992 | Ishida et al. | |
| 5,123,823 | 6/1992 | Banjo et al. | |
| 5,133,921 | 7/1992 | Yokoyama | |
| 5,174,942 | 12/1992 | Barnadas | |
| 5,316,463 | 1/1994 | Neu | 425/116 |
| 5,405,255 | 4/1995 | Neu | 425/116 |

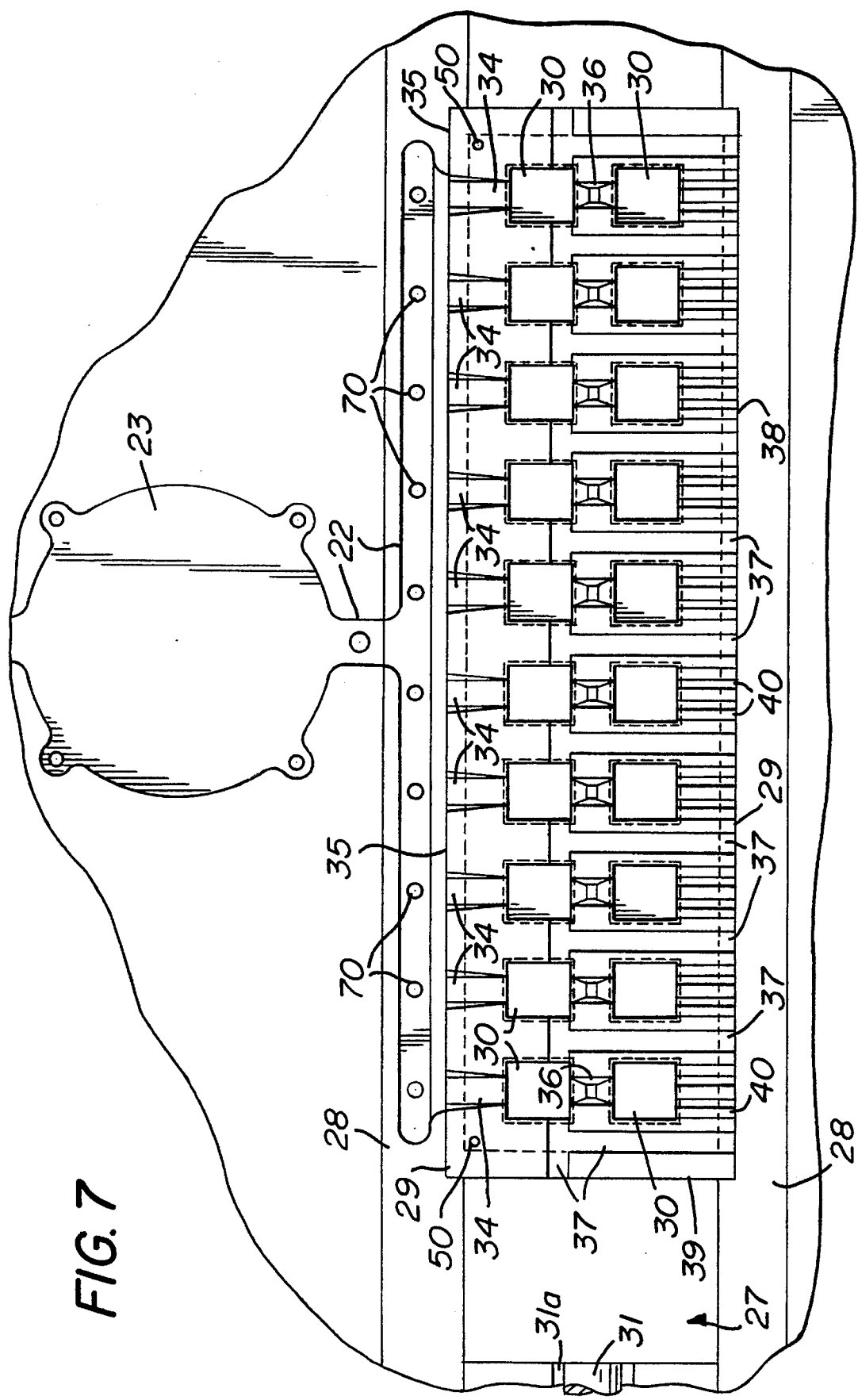

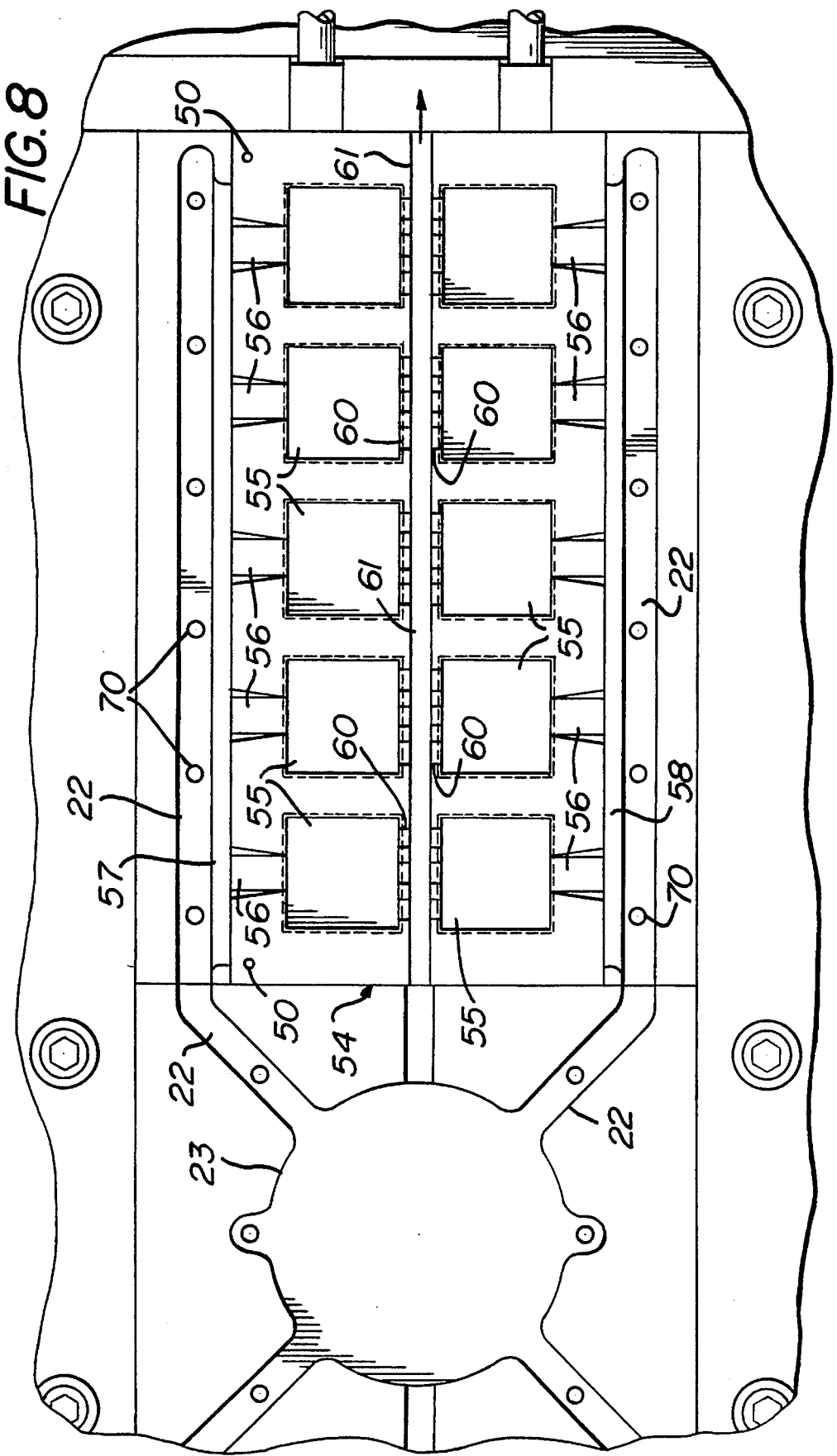

ENCAPSULATION MOLDING EQUIPMENT

RELATED APPLICATIONS

This application is a continuation of U.S. Ser. No. 08/271,149, filed Jul. 6, 1994, now U.S. Pat. No. 5,409,362, granted Apr. 25, 1995, which is a continuation-in-part of U.S. Ser. No. 08/108,335, filed Aug. 18, 1993, now abandoned, which is a continuation-in-part of U.S. Ser. No. 08/052,545, filed Apr. 23, 1993, now U.S. Pat. No. 5,405,255, granted Apr. 11, 1995, which is a continuation-in-part of U.S. Ser. No. 07/981,742, filed Nov. 24, 1992, now U.S. Pat. No. 5,316,463, granted May 31, 1994.

FIELD OF THE INVENTION

This invention relates to the encapsulation molding of objects mounted on a strip-type carrier substrate and while not limited thereto is particularly directed to the encapsulation molding of electrical or electronic circuit components, such as semi-conductor chips previously fabricated on the carrier strip.

BACKGROUND OF THE INVENTION

Encapsulation molding equipment of the general kind referred to is disclosed, for example, in U.S. Pat. No. 4,368,168 dated Jan. 11, 1983. As disclosed in this patent, in the process of manufacturing semi-conductor chips, elongated strips, usually made of copper or other conductive metal, and commonly called lead frames are provided. The strips of conductive metal are conventionally fabricated by stamping to form support platforms for the chips and electrical leads extending from each platform in predetermined pattern to the strip boundaries or to narrow cross pieces according to the design of the particular chips to be mounted on the support platforms. As a final step in the manufacturing process, the leads are eventually severed from the cross pieces and the boundaries after the chips are formed on the platforms, encapsulated and ready for testing and shipment.

In encapsulating the chips, an extreme degree of care must be taken to avoid touching by the hands. In the case of modern semi-conductor chips, the static electricity passing through the delicate microcircuitry on account of touching the unprotected chip, as well as the transfer of contaminants from the fingers of workers, may render it nonfunctional. In order to avoid this, considerable care must be taken to eliminate physical handling. This has been accomplished in the past by relatively expensive and complicated molds which have a large number of parts which are difficult to operate and to clean following use and are subject to undue wear and damage. In addition, known molding equipment is adaptable to encapsulation molding on only one size chip requiring separate and rather complicated molds for each size chip or for each size of lead frame strip.

The molds of the invention are intended to be used in conjunction with readily available mold presses of the type manufactured, for example, by the Hull Corp. of Hatboro, Pa., U.S.A. Mold presses of the type described have relatively movable upper and lower platen members. The upper platen member is provided with a vertically extending cylindrical passageway into which a charge of encapsulating material, such as an epoxy resin, is adapted to be placed. The resin in solid form is heated in a preheating oven prior to its deposit in the passageway so that it is already relatively soft in consistency. The resin is then placed within the cylindrical passageway where it is heated by heating elements extending around the passageway and becomes highly liquid within a relatively short period of time. A piston forces the liquefied resin to flow from the bottom of the passageway outwardly through a series of runners to mold cavities for encapsulating objects as is known in the art.

SUMMARY AND OBJECTS OF THE INVENTION

The present invention involves the encapsulation of semi-conductor chips or similar objects fabricated on the surface of a carrier strip-type substrate which is preferably formed of a glass fiber reinforced epoxy material. The objects are encapsulated within a protective body preferably formed of a resin material, such as an epoxy, there being a multiplicity of objects on each piece of carrier strip material. The invention in preferred form contemplates a method and apparatus for the encapsulation molding of plural, relatively thin chips mounted on one planar surface of strips formed of plastic material, such as glass fiber reinforced plastic material, and in particular, to a strip construction where the leads are integrally molded into the strip and terminate in a matrix of contact points on the other planar surface. The chips and the leads previously formed on the strip are placed in rows disposed in spaced relationship on the strip. The invention is intended to accommodate strips of different width, thickness and length, as well as strips having a range of numbers of chips, as well as sizes of chips, disposed thereon and to minimize mold set time. The invention is of particular applicability to the elimination of the entrapment of gases within a mold cavity and to the molding of very thin chips or like devices on a substrate.

In carrying out the invention, one or more removable loading bar members is adapted to be interfitted into recesses in the support surface of a support platform mounted on a platen of the mold press. Each loading bar member has an upper planar surface for support of any one of a group of chip carrying strips having different numbers or sizes of chips arranged in rows or strips and is intended to accommodate a range of lengths, thicknesses and widths. The invention further contemplates the provision of cover plates termed cavity inserts which have plural rows of spaced apart cavities extending therethrough. Preferably, one cavity insert is reserved for each of the separate strips of the group of strips. The cavities within a cavity insert are equal in number to chips on the corresponding strip and are dimensioned so that they accept the chips to be encapsulated on that particular strip and receive a charge of encapsulating resin sufficient to encapsulate the chip within each cavity. An important aspect of the invention is the provision of a series of cavity inserts in which the walls of the cavities of a particular insert correspond in thickness to the height of the objects on a particular strip. Support means independent of the mold bars maintains the upper surface of all cavity inserts of the series coplanar with the surface of the support platform. Further in accordance with the invention, gate passages formed in the cavity inserts lead to each individual cavity for the particular strip. The gate passages are formed exclusively in the cavity inserts on the surface of the cavity insert away from the removable loading bar. Gate passages formed in the inserts having a decreasing cross-section in the direction of the mold cavities provide for an acceleration of the liquid resinous material into each cavity. Vent passages for each cavity having a relatively large and increasing cross-section in turn produce an acceleration of the vented gases out of the cavity.

The invention further provides locating pins which locate the strips on a surface of a removable mold member and maintain the relative position of the mold base member, the strips and the cavity insert, independently of the dimensions of the particular strip within the group of strips which the mold is intended to receive.

The invention further contemplates the use of knockout pins for the removal of solidified resin from the mold runner structure when the mold press is opened and a gate runner construction which promotes break off of the resin within the runners from the encapsulated parts as the resin is removed from the runners in a manner which leaves substantially no flashing on the encapsulated object. Still further, the knockout means includes push pins which operate in sequence with the knockout pins to push out the removable loading bar from its supporting recess once the resin within the runners has been knocked-out and separated from the encapsulated parts.

In combination with the above, the invention provides means for vertical adjustment of the loading bar relative to the cavity inserts thereby accommodating substrates of a range of thicknesses. Preferably, the loading bars are yieldably mounted so that a uniform sealing pressure can be established between the loading bar, the cavity insert and the upper mold plate.

Advantages and objects of the invention are the provision of a mold structure comprising removable bars common to any one of a series of semi-conductor device carriers of a range of dimensions and having different numbers and/or sizes of semi-conductor devices carried thereon in combination with cavity inserts individual to each one of a group of carrier strips.

A further object of the invention is a provision of molding apparatus in which the member exposed to the greatest degree of wear and likelihood of damage, namely the mold cavity insert, is of relatively simple construction and can be readily replaced at low cost when worn without the need to replace other elements of the mold structure.

A still further object of the invention is the provision of cavity inserts, each having a larger number of cavities for the simultaneous encapsulation of a greater number of IC devices.

Still another object of the invention is the provision of a mold construction which is simple to clean following use and minimizes down time during the encapsulation molding of parts.

Another object of the invention is the provision of a mold construction which substantially eliminates set-up time when changing the mold for the encapsulation of one size of objects or substrate to another.

A further object of the invention is the provision of apparatus and method which accommodates differences in thickness of the epoxy board substrates, as well as differences in the dimensions and number of the objects to be encapsulated through the use of interchangeable mold cavity inserts.

A further object of the invention is the provision of knockout means for facilitating the removal of resin within the resin delivery runner system following encapsulation molding and the provides for removal of the mold from its support structure thereby facilitating production.

A still further object of the invention is the provision of a centering system for locating the chip carrying strips in position within the mold irrespective of differences in the number or size of the chips or the dimensions of the chip carrier strips.

Another objective of the invention is the provision of a strip locating system within the mold which allows for axial expansion of the elongated strips of strip material.

A still further object of the invention is the provision of a gate structure within the mold cavity insert which restricts the delivery of resin to the number of objects to be encapsulated thereby eliminating waste of resin.

Yet another object of the invention is the provision of gate and vent passages for the cavities configured to eliminate gas entrapment in the mold cavity by accelerating the flow of resin into the cavities and the rapid venting of gases displaced by the liquid resin.

A still further object of the invention is the elimination of voids and gas bubbles within the encapsulation resin surrounding electronic chips and other relatively small objects.

Other objects and advantages of the invention will become apparent from the following detailed description of the preferred embodiment of the invention.

DESCRIPTION OF THE DRAWINGS

FIG. 7 is a fragmentary plan view on an enlarged scale of a portion of the mold structure shown in FIGS. 1-4; and FIG. 8 is a plan view of an alterative form of the mold structure of FIG. 7.

DETAILED DESCRIPTION OF THE PREFERRED EMBODIMENT OF THE INVENTION

Figure 1:
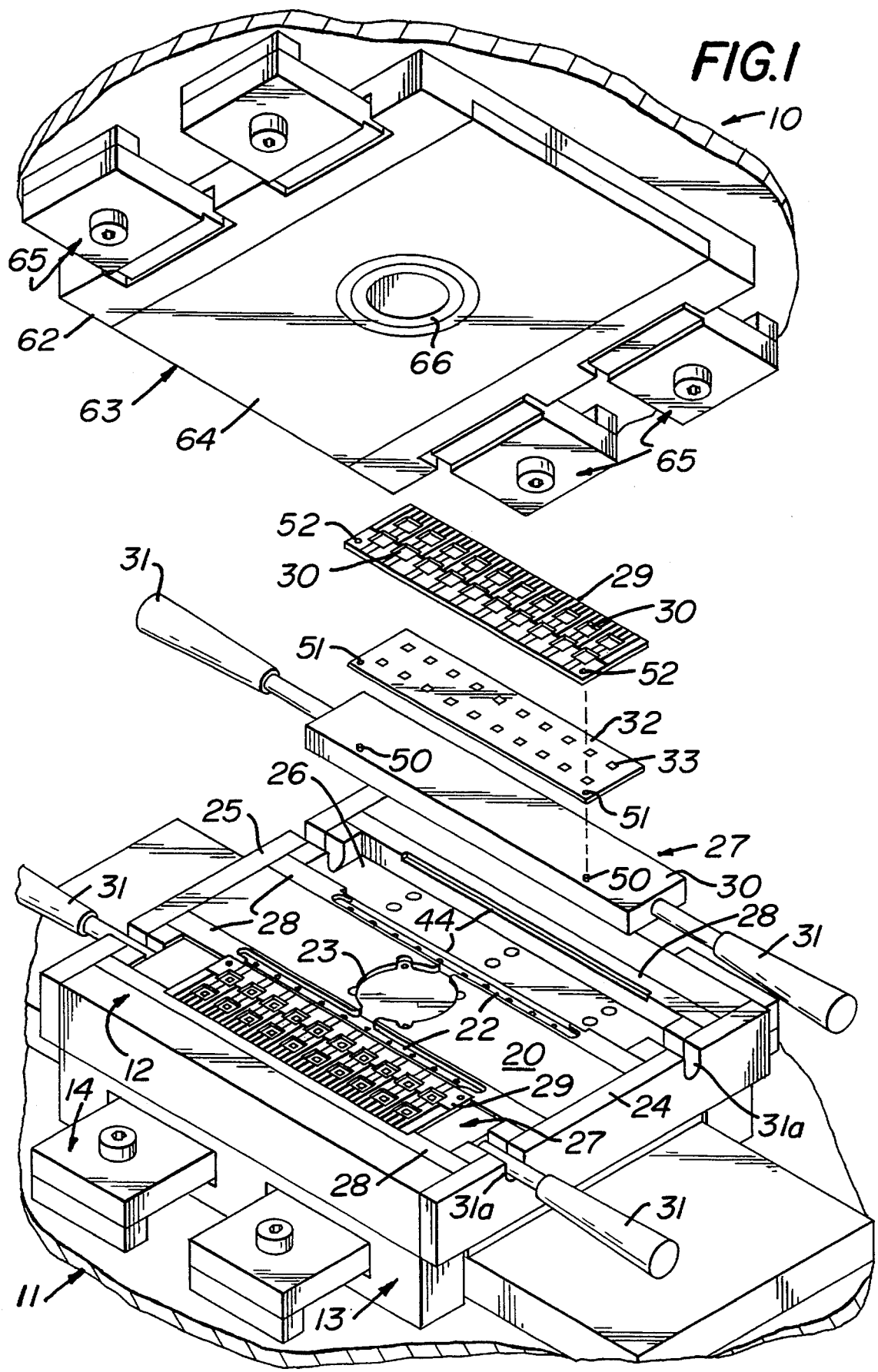
FIG. 1 is an exploded perspective view schematically representing a mold formed in accordance with the present invention.
Figure 2:
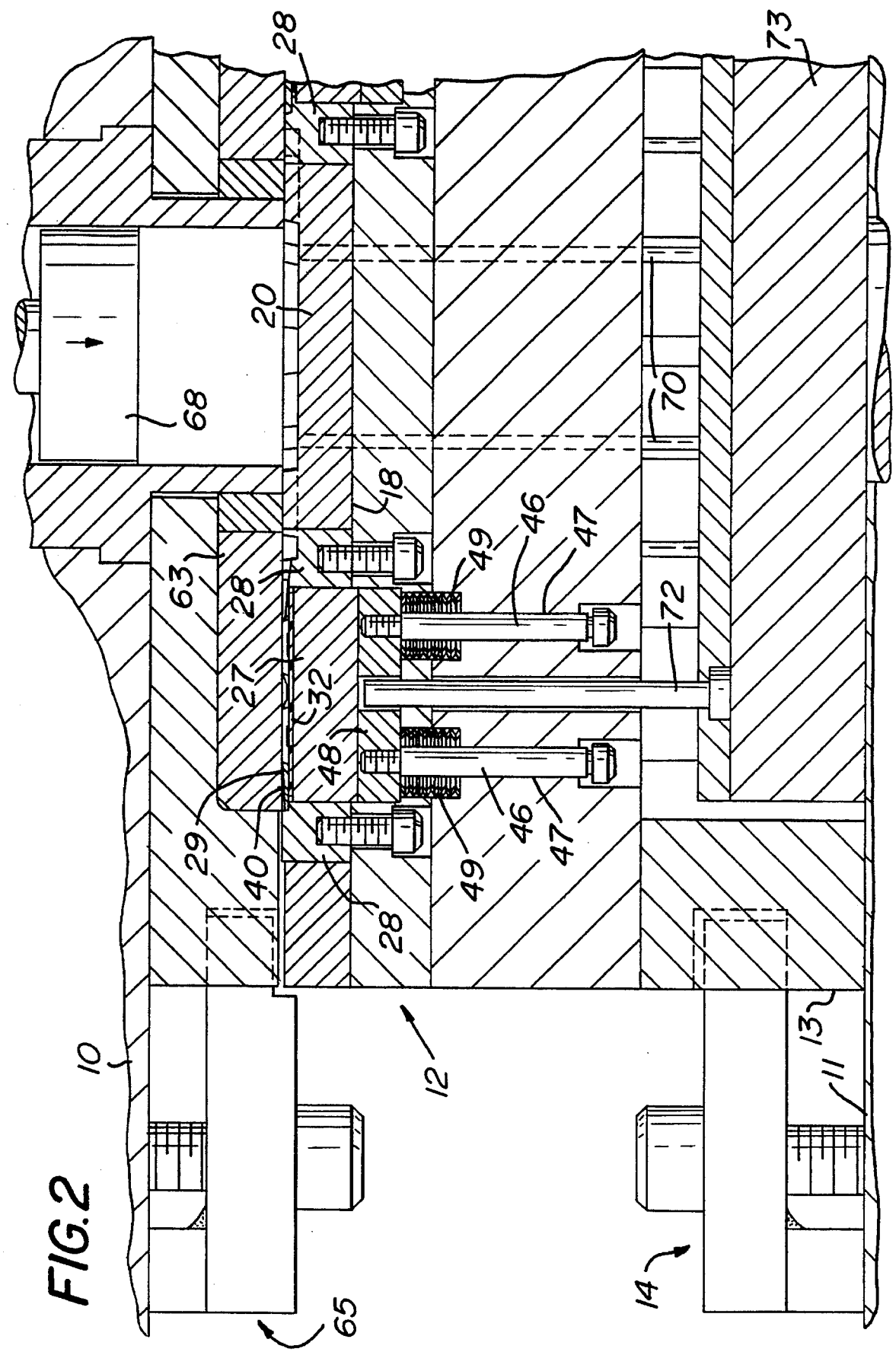
FIG. 2 is a sectional view taken on line 2—2 of FIG. 1.
Figure 3:
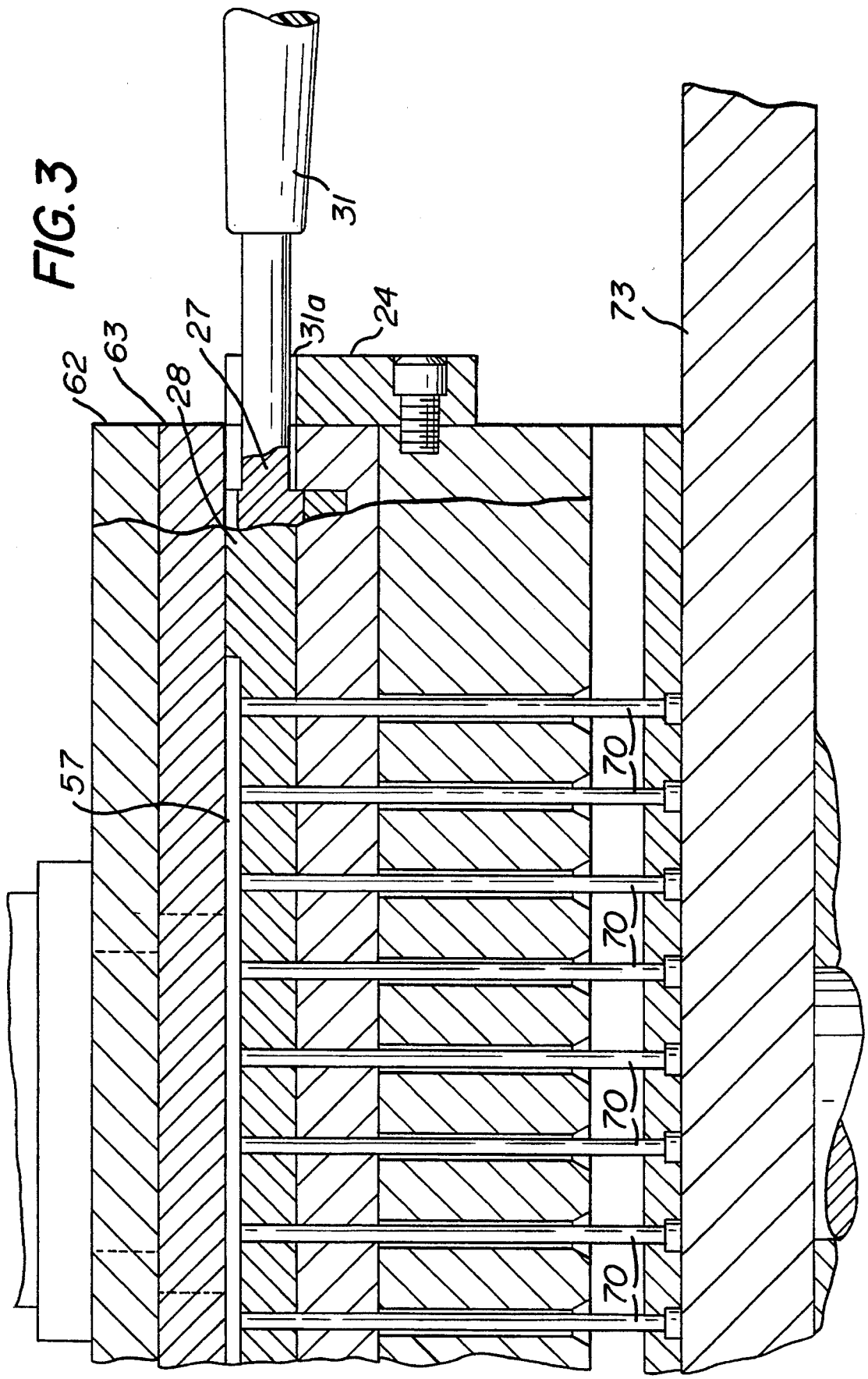
FIG. 3 is a sectional view taken on line 3—3 of FIG. 1.
Figure 4:
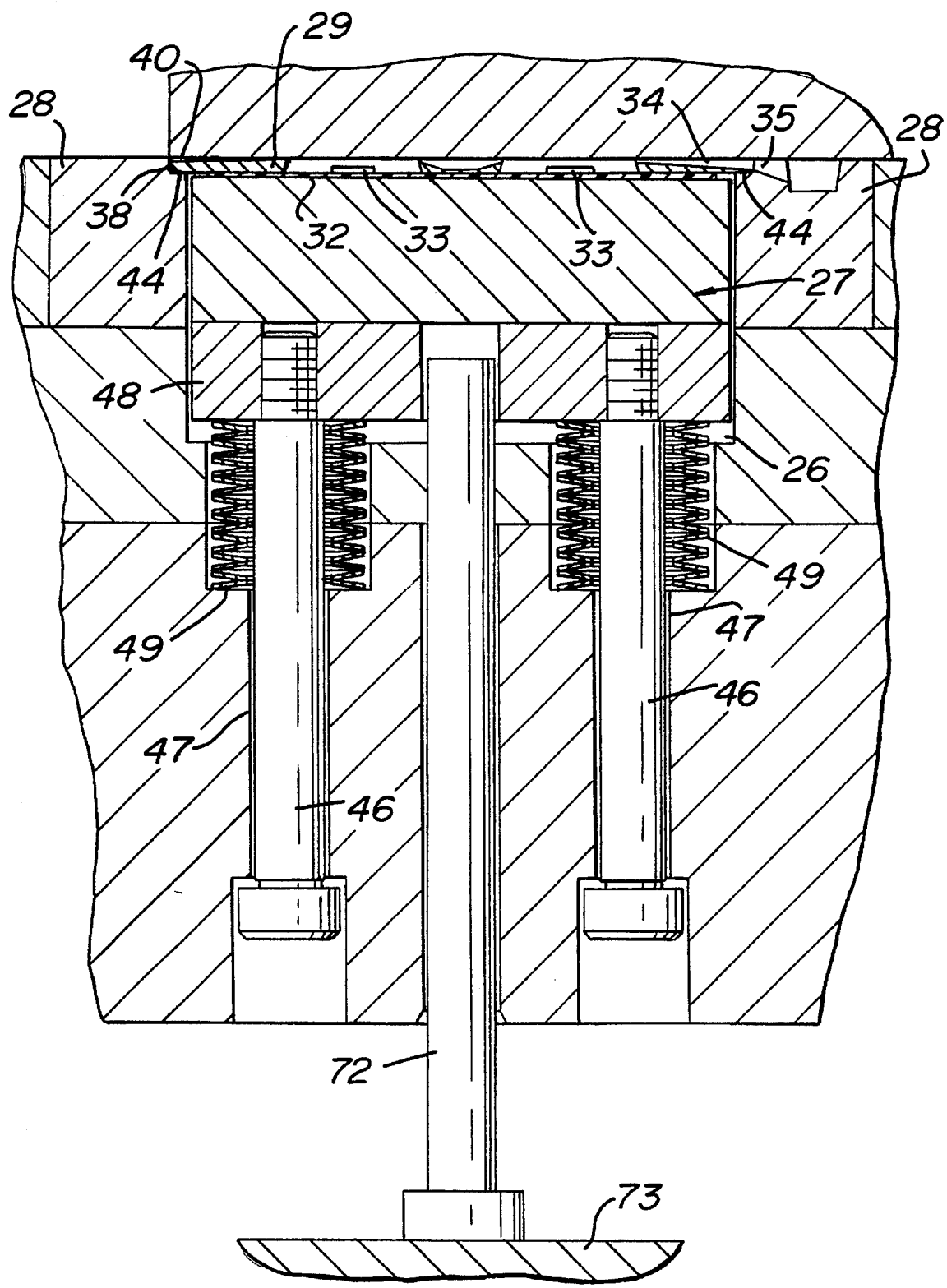
FIG. 4 is a fragmentary sectional view taken on line 4—4 of FIG. 1.

Referring first to FIGS. 1–3, the molding apparatus of the present invention is mounted in a mold press comprising an upper platen member 10 and a lower platen member 11, both of which are mounted for relative vertical movement by means, not shown, between an open position and the position illustrated in FIGS. 3 and 4 wherein the mold parts supported on the lower platen member 11 are clamped and sealed together pursuant to a molding operation as is known in the art. The mold press is of conventional construction and is generally of a type supplied by the Hull Corp., more fully identified above.

As is best seen in FIGS. 1 and 2, the mold comprises an elevated mold support platform or plate 12 supported by elongated risers 13 which are clamped to the platen 11 by means of L shaped brackets 14. Brackets 14 have horizontally extending arms 14a which fit within spaced recesses 15 formed within the outer surface of risers 13 and bear against the platen on feet 14b. One or more machine bolts 16 directly bolt each bracket 14 to the lower platen 11 and clamp mold support platform 12 tightly in position. Support pillars 17 bolted to the underside of the platform may be provided as required to eliminate flexure when the parts of the mold are pressed together.

Mold support platform 12 has a central recessed portion 18 in the center of which an elongated center block or plate 20 is mounted, as shown in FIGS. 1 and 2. As will be explained in more detail hereinafter, the upper surface of center block 20 provides a means for the delivery of liquefied encapsulating resin through a pair of runner and cull passages generally indicated at 22 and which extend from opposite sides of a central recessed resin receptacle 23.

Secured to sides of platform 12 are side frame members 24 and 25 (FIGS. 1 and 3). The center block 20, the side frame members 24 and 25 and the raised end edges of the support platform define a pair of elongated mold support recesses 26 having vertical side walls. As is shown in FIGS. 2 and 4, the sides of the recesses 26 are preferably defined by separate, removable side members 28 bolted to suitable supports underlying the platform 12.

The support recesses 26 receive removable elongated rectangular loading bars 27 which are intended to support the carrier strips on which the devices to be encapsulated are placed and cover plates termed cavity inserts 29 which have a plurality of rows of a plurality of cavities 30. Each cavity is positioned to enclose one of the devices to be encapsulated and a charge of encapsulating resin.

Molding equipment including two loading bars 27 is illustrated in FIG. 1. Each loading bar 27 has an upwardly facing planar surface 30 for support of one or more carrier strips, as further explained below. The loading bars are preferably provided with handles 31 which extend from the bar ends and fit within notches 31a in the side frame members 24 and 25 to facilitate transportation, placement of a loading bar within the mold and its removal at the conclusion of a molding operation.

Figure 6:
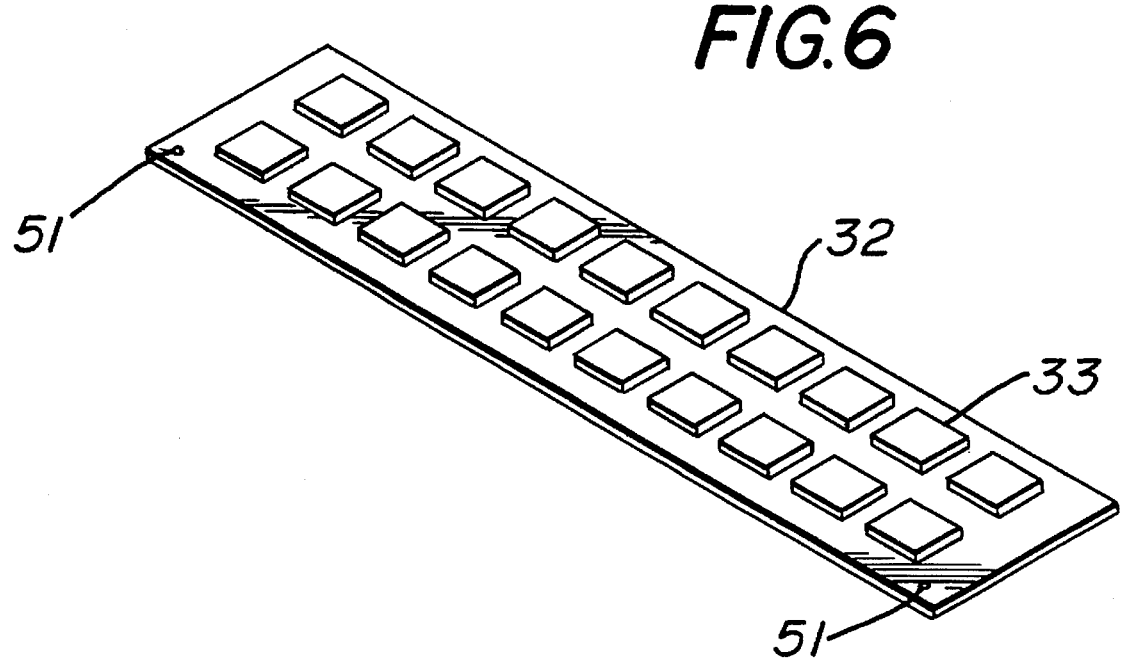
FIG. 6 is a fragmental view of a mold illustrating the use of a second form of cavity insert.

The elongated carrier strips, as identified by reference character 32, carry a plurality of objects to be encapsulated, such as semi-conductor chips. The chips are prefabricated on the strip surfaces and have leads embedded in the strip material. One such strip with two rows of chips 33 already encapsulated is illustrated in FIG. 6. Although chips fabricated on conventional lead frame strips stamped from a conductive material, such as copper, may be encapsulated using the equipment and method of the invention, the strips are preferably formed of a glass fiber reinforced plastic material, such as epoxy, and may have any number of chips, usually from about one to six, formed on the upper surface thereof in a predetermined spaced relationship.

The invention contemplates the provision of molding equipment intended for the encapsulation of plural objects, such as the semi-conductor chips of FIG. 6 of predetermined different sizes and especially of differing vertical dimension, as well as differences in number and spacial relationship on the strips. Particular features of the invention involve the simultaneous encapsulation of an increased number of chips or other objects and the accommodation of objects of a range of thicknesses using one of a group of cavity inserts each having cavities of a size individual to a particular size and spacing of the objects to be encapsulated. When change is required for encapsulating a different size or number of chips, the only mold part to be changed is the cavity insert. In addition, the invention is intended to accommodate strips that differ in length, width and strips of a range of thicknesses.

A cavity insert 29 is illustrated in FIGS. 1, 2, 4 and 7. As shown in these views, two rows of cavities 30 are provided in each cavity insert. Gates 34 formed in the upper planar surface of each cavity insert extend from a side edge 35 to each of the cavities disposed in a row adjacent to the edge. A group of bridge gates 36 extend from each of the cavities in the first row to the corresponding cavities in the second row.

Gates 34 are formed according to the teachings in my copending application Ser. No. 08/108,355. The gates 34 are preferably formed exclusively on the upper surfaces 30 of the cavity inserts and have an upwardly sloping bottom wall portion 34a sloping upwardly from edge 35 at an angle which is typically about 25° and angled side walls 34b which typically are angled inwardly at an angle of about 10° towards the cavities of the first row. The progressively decreasing cross-section of the gates 34 serves to accelerate resin flow into each of the cavities in the first row. A relatively thin cross-section of material at the gate exit provides a clean separation of the gate material from the encapsulated device when the strips with the encapsulated devices are removed from the mold. The resin is directed to the upper portion of each cavity in order to avoid erosion of the strip material and damage to the circuit device.

Similar to gates 34, bridge gates 36 have a relatively small cross-section at the junction with the cavities 30 of the two rows, further providing a clean break line with encapsulated devices.

As shown in FIG. 7, all cavities in inserts 29 are vented by venting means comprising a series of venting grooves in upper plate surface 30. A first series of vent grooves 37 extend from the cavities in the first row to insert side edge 38 and to ends 39. A second series of vent grooves 40 extend to edge 38. The vent grooves of the second series have a combined cross-section approximately equal to the cross-section of first series 37.

It can be seen that the cavity insert of FIGS. 1, 2, 4 and 7 has a uniform thickness which accommodates the IC devices plus a sufficient layer of resin to adequately encapsulate the device and, as illustrated in FIG. 4, is sufficiently wide to be supported independently of the mold, as will be described hereinafter. By way of example, an insert 29 having a thickness of about 0.046" is about as large as is likely to be required to encapsulate of the larger size of modern clips.

Figure 5:
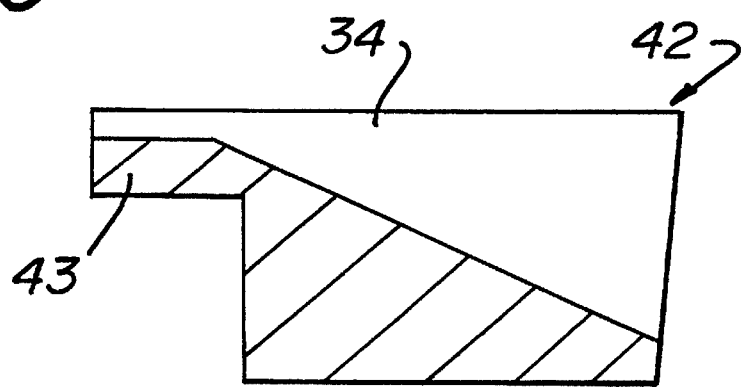
FIG. 5 is a fragmental view, on an enlarged scale, of a cavity insert used in a mold of the present invention.

FIG. 5 is a fragmentary view which illustrates a cavity insert 42 similar to the cavity insert 29 illustrated in FIGS. 1, 2, 4 and 7 but which is adapted for the encapsulation of thinner IC devices. The cavity insert 42 has an edge portion of equal thickness to the edge portions of cavity insert 29 so that the upper planar surface of the insert is coplanar with the lower mold surface surrounding the insert. As distinguished from insert 29, insert 42 has a relatively thin central portion 43 which straddles the loading bar 27. The central portion 43 has a thickness which allows for accommodation of an IC device which is at the low end of the range of thicknesses of IC devices which are to be encapsulated. Insert 42 is preferably otherwise identical in form to insert 29 with vent and gate passages formed exclusively in the insert upper surface.

Means for support of the cavity inserts independently of the loading bars preferably comprise recessed steps 44 formed along the side edges of recesses 26. Both forms of cavity insert are dimensioned so that the upper surface of the cavity insert is substantially coplanar with the surface of center block 20 when the insert rests on the steps 44.

Preferably, as can be seen in FIG. 3, means are provided for vertical adjustment of a loading bar so that differences in the thickness of a particular substrate can be accommodated. In a further preferred form, the adjustable means comprises a yieldable means. According to FIG. 3, the yieldable means comprises elongated shoulder bolts 46 which fit into bores 47 and threaded into plates 48 which support the loading bars 27. Preferably, the upper end of each bore 47 is counterbored to accept a plurality of disc springs 49. The height of loading bar is yieldably adjusted by varying the number of disc springs 49, thus assuring that a seal is established at the upper and the lower surface of the cavity insert when the mold is assembled and closed.

Means comprising pins 50 extend upwardly from the upper surface of each loading bar for accurately locating the carrier strips and the cavity insert. As can best be seen in FIG. 1, the pins extend through openings 51 within a carrier strip and through openings 52 in the cavity inserts.

FIG. 8 is a plan view of a mold utilizing a cavity insert having a modified orientation of gate and vent passages. The insert, indicated by the reference character 54, has two rows of cavities 55 and gates 56 which extend from the side edges 57, 58 to an adjacent cavity. Vent grooves 60 extend from the opposite sides of the cavities to a central vent groove 61 extending lengthwise of the plate. Central vent groove 61 exits at the end of the cavity insert through a spaced formed between the upper and lower plate members 10 and 11. Gates 56 are preferably formed with an upwardly sloped bottom wall and inwardly converging side walls, as described above with respect to gates 34.

Inserts 54 may have a constant thickness or be formed with a central portion of reduced thickness in the manner illustrated in FIG. 5.

The cavity inserts of FIG. 8 are adapted to rest on steps 44 in the manner illustrated in FIG. 7 and overlie the clip carrying strips which are, in turn, mounted on yieldably adjustable loading bars of the kind shown in FIG. 2.

Resin is delivered to the cavities in the inserts from central receptacle 23 and runner and cull passages 22 which extend in bars 28 along the edge of recess 26.

With reference again to FIGS. 1–4, the upper mold construction comprises upper mold member 62 mounted on upper platen 10 and has a recess which receives an upper mold plate 63 having a lower planar surface 64. The upper mold member 62 is clamped in place by any suitable means, such as brackets 65 of construction similar to brackets 14. Extending through the upper mold member 63 is a cylindrical resin receptacle 66 in axial alignment with the central receptacle 23 centrally located in the upwardly facing surface of center block 20.

When the platens are moved together, surface 64 on the upper mold insert plate 63 presses against the upper surface of each of the cavity inserts 29 so as to effect a seal, as can best be seen in FIG. 2. Resin receptacle 66 registers with resin receptacle 23. Encapsulating resin inserted into the upper end of the receptacle 66 in preheated and relatively soft form is heated by heater means, not illustrated, to reduce the resin to a highly liquid form. A hydraulic piston 68, schematically shown in FIG. 2, forces the resin outwardly through the resin runner passages extended along the side edges of the center plate and communicating with the gates in the cavity inserts so as to fill the mold cavities within each insert.

Means are provided for removing the loading bars from the mold when the mold is open and for simultaneously removing the solidified resin from the runners and gate passages. For this purpose, resin knockout pins 70, shown in FIG. 3, are positioned in openings in the bottom of the receptacle and the runner passages and additional knockout pins 72 are located in openings beneath loading bars 27, as shown in FIG. 3. Both sets of pins are mounted on stationary support 73. As the mold opens, the pins are molded relatively to the openings. Preferably, the pins 70 and 72 are of length relative to the pins 70 so that the pins 70 first strike the solidified resin within the runner and cull passages to lift it up to cause the resin to fracture within the narrow section of the gate where the gate passage joins the cavity. The knockout pins 72 next strike the loading bars, knocking them out of their locating recesses as the upper and lower plane separate. When the mold is fully opened, the operator can manually lift each loading bar by grasping the loading bar handles 31.

In operation of the molding equipment of the present invention, the loading bars 27 are loaded with carrier strips 32 each carrying rows of chips to be encapsulated. In loading the strips 32, the index openings 51 are fitted over pins 50, thereby positioning each strip on the loading bar upper surface. A cavity insert of form illustrated at 29, 42 or 54 having cavities in rows corresponding to the number of chips on the particular epoxy board 32 and otherwise dimensioned so that the cavities correspond to those on the strip is placed on each loading bar 27. As can be seen in FIG. 1, the locating pins 50 extend through the pair of openings in the cavity inserts so that each base member, strip and cavity insert is maintained in the intended relationship.

With the mold press open, a predetermined number of disc springs 49 are fitted onto the shanks of bolts 46 so that the loading bar is adjusted to the required height. The loading bars are next fitted into recesses 26 and the side surfaces of the cavity inserts are supported on the steps 44. The mold is then closed, and preheated resin is then supplied to the resin receptacle 60 and the piston 68 is actuated to force liquefied resin from receptacle 23 through runners 22 into the cavities within the cavity inserts.

Upon curing of the resin, the mold press opens, causing pins 70 to remove waste solidified resin from the gates and runners 22 and the receptacle 23 and effecting a fracture of the resin within each shallow gate at the point of entry into a cavity. Immediately thereafter, the knockout pins 72 raise the loading bars from the recesses 26.

I claim:

1. Encapsulating mold equipment for use in a mold press having a base platen, an upper platen having an upper mold surface overlying said base platen, said base platen and said upper platen being relatively movable between an open position and a closed position, said equipment comprising:

encapsulating fluid passage means on said base platen, said encapsulating fluid passage means including a surface raised relatively to said base platen and having runner passages formed therein for distribution of said encapsulating fluid to the mold under pressure;

a mold base member;

means for support of said mold base member on said base platen in adjacent relationship to said raised surface and to the runner passages in said raised surface of said encapsulation fluid delivery means, said mold base member having a substantially imperforate upwardly facing substantially planar support surface for support of strip material having an upper surface with a plurality of spaced apart devices to be encapsulated disposed thereon, said strip material having a substantially flat lower surface interfacing with said upwardly facing planar support surface;

a substantially rectangular cavity insert disposed on the mold base member in overlying relationship to said strip material, said cavity insert having a plurality of cavities extending therethrough, said cavities being spaced in a plurality of rows extended lengthwise of the cavity insert, there being a cavity for each of the devices on the upper surface of said piece of strip material, the cavities being dimensioned and positioned to receive said devices and a charge of encapsulating fluid sufficient to form an encapsulating layer covering each said device on said piece of strip material, said cavity insert having a lower sealing surface surrounding each cavity and cooperating with the upper surface of said strip material on said upwardly facing planar support surface to form with said strip material a seal surrounding each said device, said cavity insert further having an upper sealing surface cooperating with said mold surface of said upper mold platen to form a seal with said upper mold plate when the upper and lower platens are in the closed position;

said cavity insert having first and second side edges and gate passage means comprising gate grooves formed exclusively in said upper sealing surface, said gate grooves extending from said runner passages adjacent one of said side edges to said cavities, said gate grooves and said runner passages in said raised surface being in fluid communication when the cavity insert is disposed on said mold base member for the delivery of a charge of encapsulating fluid from said runner passages through said gate grooves to each of said cavities;

cavity insert support means on said base platen for support of said cavity insert independently of said mold base member; and adjustable means acting on the mold base member and moving the mold base member relatively upwardly, whereby a carrier strip supported on said mold base member is maintained in sealing relationship with the lower surface of said cavity insert.

2. Encapsulation mold equipment according to claim 1, wherein said adjustable means includes means biasing the mold base member relatively upwardly.

3. Encapsulating mold equipment for use in a mold press having a base platen, an upper platen having an upper mold surface overlying said base platen, said base platen and said upper platen being relatively movable between an open position and a closed position, said equipment comprising:

encapsulating fluid passage means on said base platen, said encapsulating fluid passage means including a surface raised relatively to said base platen and having runner passages formed therein for distribution of said encapsulating fluid to the mold under pressure;

a mold base member;

means for support of said mold base member on said base platen in adjacent relationship to said raised surface and to the runner passages in said raised surface of said encapsulation fluid delivery means, said mold base member having a substantially imperforate upwardly facing substantially planar support surface for support of strip material having an upper surface with a plurality of spaced apart devices to be encapsulated disposed thereon, said strip material having a substantially flat lower surface interfacing with said upwardly facing planar support surface;

a substantially rectangular cavity insert disposed on the mold base member in overlying relationship to said strip material, said cavity insert having a plurality of cavities extending therethrough, said cavities being spaced in a plurality of rows, extended lengthwise of the cavity insert, there being a cavity for each of the devices on the upper surface of said piece of strip material, the cavities being dimensioned and positioned to receive said devices and a charge of encapsulating fluid sufficient to form an encapsulating layer covering each said device on said piece of strip material, said cavity insert having a lower sealing surface surrounding each cavity and cooperating with the upper surface of said strip material on said upwardly facing planar support surface to form with said strip material a seal surrounding each said device, said cavity insert further having an upper sealing surface cooperating with said mold surface of said upper mold platen to form a seal with said upper mold plate when the upper and lower platens are in the closed position;

said cavity insert having first and second side edges and gate passage means comprising gate grooves formed exclusively in said upper sealing surface, said gate grooves extending from said runner passages adjacent one of said side edges to said cavities, said gate grooves and said runner passages in said raised surface being in fluid communication when the cavity insert is disposed on said mold base member for the delivery of a charge of encapsulating fluid from said runner passages through said gate passage to each of said cavities, said gate grooves extending from the cavities in one of said rows to a first of said side edges and from the cavities in the other of said rows to the second of said side edges, the runner passages extending along both of said side edges;

vent grooves for each of said cavities, said vent grooves being formed exclusively in the upper surface of said insert extending from the cavities to at least one of the ends of said insert;

means on said base platen for support of said cavity insert independently of said mold base member; and adjustable means acting on the mold base member and moving the mold base member relatively upwardly, whereby a carrier strip supported on said mold base member is maintained in sealing relationship with the lower surface of said cavity insert.

4. Encapsulation mold equipment according to claim 3, wherein said adjustable means includes means biasing the mold base member relatively upwardly.

* * * * *